US008917523B2

(12) United States Patent
Miwa

(10) Patent No.: US 8,917,523 B2
(45) Date of Patent: Dec. 23, 2014

(54) BOARD CONNECTOR

(75) Inventor: Takeya Miwa, Makinohara (JP)

(73) Assignee: Yazaki Corporation, Tokyo (JP)

( * ) Notice: Subject to any disclaimer, the term of this patent is extended or adjusted under 35 U.S.C. 154(b) by 79 days.

(21) Appl. No.: 13/122,193

(22) PCT Filed: Oct. 16, 2009

(86) PCT No.: PCT/JP2009/068217
§ 371 (c)(1), (2), (4) Date: Apr. 1, 2011

(87) PCT Pub. No.: WO2010/044492
PCT Pub. Date: Apr. 22, 2010

(65) Prior Publication Data

US 2011/0188217 A1 Aug. 4, 2011

(30) Foreign Application Priority Data

Oct. 16, 2008 (JP) ................................. 2008-267699

(51) Int. Cl.
*H05K 7/02* (2006.01)
*H05K 7/04* (2006.01)
*H01R 12/70* (2011.01)

(52) U.S. Cl.
CPC .................................. *H01R 12/7047* (2013.01)
USPC ........................................... 361/807; 174/261

(58) Field of Classification Search
CPC ........................ H01R 23/7042; H01R 12/7047
USPC .......... 174/250, 260, 261; 361/748, 807–809, 361/825; 439/573, 564, 567, 59
See application file for complete search history.

(56) References Cited

U.S. PATENT DOCUMENTS 6,098,938 A * 8/2000 Tsai .............................. 248/200
6,824,407 B1 * 11/2004 Zhao et al. .................... 439/157

(Continued)

FOREIGN PATENT DOCUMENTS

GB 1220752 1/1971
GB 2336043 A 10/1999

(Continued)

OTHER PUBLICATIONS

Communication from the Japanese Patent Office dated Sep. 27, 2012, in a counterpart application No. 2008-267699.

(Continued)

*Primary Examiner* — Yuriy Semenenko
(74) *Attorney, Agent, or Firm* — Sughrue Mion, PLLC

(57) ABSTRACT

In a board connector wherein fixing portions 5 which have respective screw holes screw holes each into which a screw member passed through the circuit board is threaded and are adapted to fix a housing 3 to the circuit board by tightening the screw members are integrally provided at the synthetic resin-made housing 3 adapted to be mounted in an upstanding manner on the circuit board, the fixing portions 5 are provided in a projecting manner at that portion of one longitudinal outer wall surface of the housing 3 disposed near to a proximal end portion thereof, and a fixing surface 5*a* of the fixing portion 5 is formed into such a shape as to restrain an end face of the housing 3 from lifting from a surface of the circuit board at the time when the fixing portion 5 is fixed to the circuit board 2 by a tightening force of the screw member 7.

1 Claim, 5 Drawing Sheets

(56) References Cited

U.S. PATENT DOCUMENTS

| | | | | |
|---|---|---|---|---|
| 7,637,748 | B2 * | 12/2009 | Chung et al. | 439/59 |
| 8,002,563 | B2 * | 8/2011 | Li et al. | 439/160 |
| 2002/0106940 | A1 | 8/2002 | Okabe et al. | |
| 2004/0121632 | A1 | 6/2004 | Takata | |

FOREIGN PATENT DOCUMENTS

| | | | |
|---|---|---|---|
| JP | 10-144417 | A | 5/1998 |
| JP | 10144417 | * | 5/1998 |
| JP | 2002-231345 | A | 8/2002 |

OTHER PUBLICATIONS

International Search Report for PCT/JP2009/068217 dated mailed Apr. 1, 2010, [PCT/ISA/210].

Office Action dated Feb. 19, 2014, issued by the State Intellectual Property Office of the People's Republic of China in counterpart Chinese Application No. 200980141462.2.

* cited by examiner

BOARD CONNECTOR

TECHNICAL FIELD

This invention relates to a board connector for mounting on a circuit board.

BACKGROUND ART

As board connectors which are mounted on a circuit board, there is known a board connector disclosed in Patent Literature 1. In this board connector, fixing portions which have respective screw holes each into which a screw member passed through the circuit board is threaded and are adapted to fix a housing to the circuit board by tightening the screw members are integrally provided at the synthetic resin-made housing adapted to be mounted in an upstanding manner on the circuit board.

The fixing portions are integrally formed on and project respectively from wall surfaces of longitudinally-opposite ends of the housing of a generally elongated rectangular tubular shape. A circuit board-side fixing surface of each of these fixing portions is held against a predetermined position of a surface of the circuit board, and the screw members are passed through the circuit board from a reverse surface thereof (a surface facing away from the surface to which the connector is fixed), and are threaded respectively into the screw holes of the fixing portions, and are tightened, and by doing so, the housing is fixed in an upstanding condition to the circuit board.

CITATION LIST

Patent Literature

PTL 1 JP-A-2002-231345

SUMMARY OF INVENTION

Technical Problem

Incidentally, in the case of mounting the board connector to the circuit board, through holes each for the passage of the screw member therethrough must be formed through the circuit board opposed to the screw holes of the fixing portions. Therefore, a wiring pattern must be installed in a manner to avoid the through holes of the fixing portions, and therefore the degree of freedom of a design of the wiring pattern is limited. Furthermore, in the case where a longitudinal dimension of the board connector is made equal to a widthwise dimension of the circuit board in order to achieve a compact design of the circuit board, the positions of the fixing portions of the board connector do not sometimes be set respectively at the longitudinally-opposite ends of the housing, but must be set, for example, at longitudinal side walls of the board connector. However, to enhance the degree of freedom of the design of the wiring pattern and to provide the fixing portions at the side walls of the board connector are, in some cases, contradictory to each other.

Solution to Problem

The problem that the present invention is to solve is to enable a compact design of the circuit board to be achieved and also to enhance the degree of freedom of the design of the wiring pattern.

In order to solve the problem, this is invention provides with a board connector comprising a circuit board, a housing comprised of a synthetic resin and mounted in an upstanding manner onto the circuit board, and a fixing portion integrally provided with the housing and having a screw hole into which a screw member passed through the circuit board is threaded, the fixing portion adapted to fix the housing to the circuit board by tightening the screw member, wherein the fixing portion is provided in a projecting manner near a proximal end portion of the housing at one side of a longitudinal outer wall surface of the housing, and a fixing surface of the fixing portion adapted to be fixed to the circuit board is formed into a shape so as to restrain an end face of the housing from lifting from the circuit board when the fixing portion is fixed to the circuit board by a tightening force of the screw member.

According to the present invention, the fixing portion is provided at the one longitudinal outer wall surface of the housing, and by doing so, for example, a widthwise dimension of the circuit board can be reduced, and therefore a compact design of the circuit board can be achieved. Furthermore, since any fixing portion is not provided at the other longitudinal outer wall surface of the housing, a wiring pattern can be freely installed on that portion of the circuit board adjacent to the other longitudinal outer wall surface of the housing, and therefore the degree of freedom of the design of the wiring pattern can be enhanced.

Furthermore, for example, if a fixing portion is provided only at one longitudinal outer wall surface of a housing and also a fixing surface is formed flush with an end face of a proximal end of the housing, the fixing portion can be compressively deformed or the circuit board can be compressively deformed by a load due to the tightening of the screw member relative to the fixing portion, depending on the material, the tightening force, etc., so that the anti-fixing portion side of the housing can be lifted to be inclined. On the other hand, in the present invention, the fixing surface of the fixing portion is formed into such a shape as to restrain the end face of the housing from lifting from the surface of the circuit board at the time when the fixing portion is fixed to the circuit board by the tightening force of the screw member, and therefore a compressive deformation caused by the tightening load can be compensated for. Therefore, the housing can be prevented from being inclined.

In this case, the fixing surface may be formed as a slanting surface which projects toward the circuit board gradually in a direction away from the housing, or a projection may be provided at a portion of the fixing surface that is opposite to the housing with the screw hole disposed therebetween.

Advantageous Effects of Invention

According to the present invention, the compact design of the circuit board can be achieved, and also the degree of freedom of the design of the wiring pattern can be enhanced.

DESCRIPTION OF EMBODIMENTS

Embodiments of board connectors of the present invention will be described below in detail with reference to the accompanying drawings.

Figure 1A:
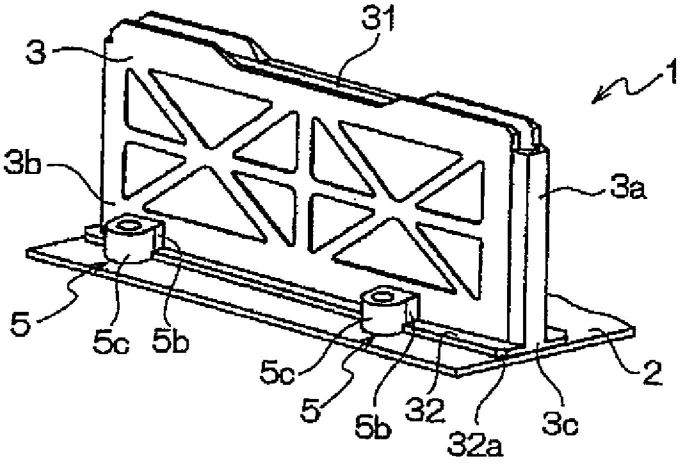
FIG. 1 (*a*) to (*d*) are views showing a condition in which a first embodiment of a board connector of the present invention is mounted on a circuit board, and (*a*) is a perspective view, (*b*) is a front-elevational view, (*c*) is a side-elevational view, and (*d*) is a en enlarged view of a portion A in the Figure.
Figure 1B:
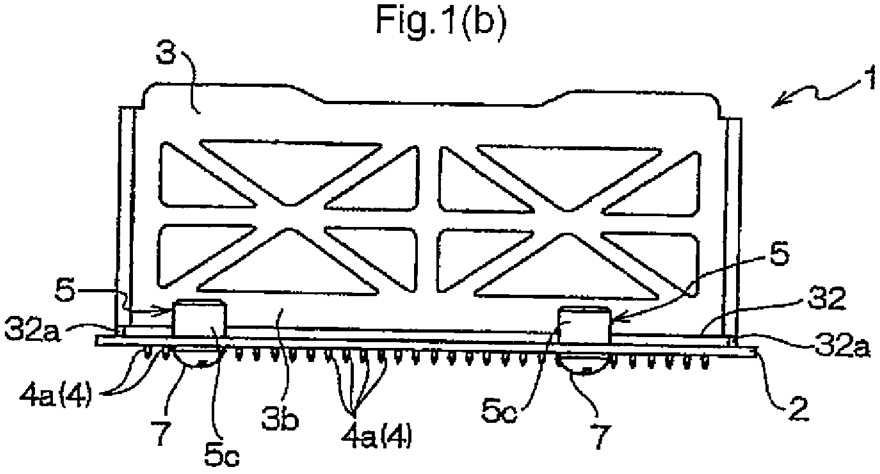
Figure 1C:
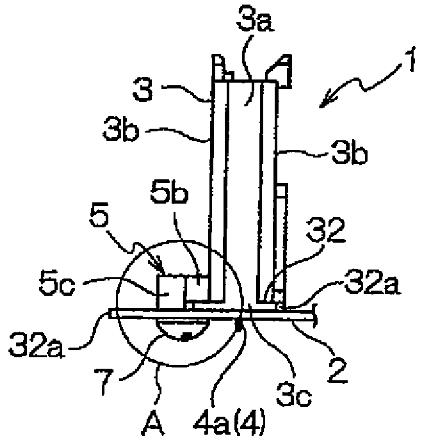
Figure 1D:
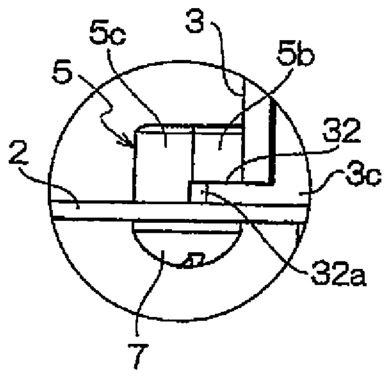
Figure 2A:
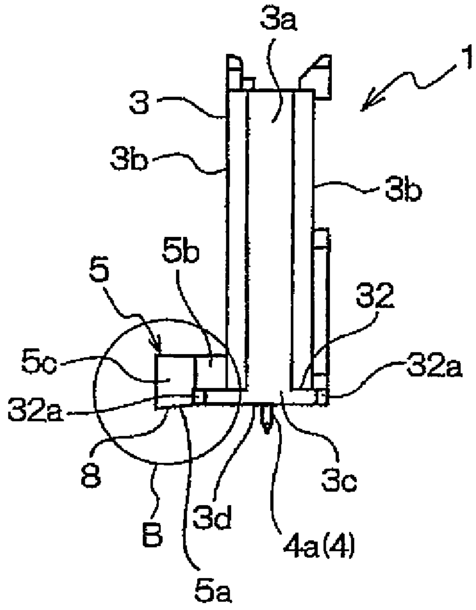
FIG. 2 (*a*) to (*b*) are views showing the first embodiment of the board connector of the present invention, and (*a*) is a side-elevational view, and (*b*) is an enlarged view of a portion B in the Figure.
Figure 2B:
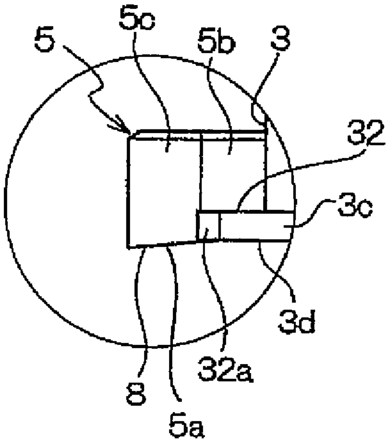

FIG. 1 (*a*) to (*d*) are views showing a condition in which a first embodiment of a board connector of the present invention is mounted on a circuit board, and (*a*) is a perspective view, (*b*) is a front-elevational view, (*c*) is a side-elevational view, and (*d*) is a en enlarged view of a portion A in the Figure. FIG. 2 (*a*) to (*b*) are views showing the first embodiment of the board connector of the present invention, and (*a*) is a side-elevational view, and (*b*) is an enlarged view of a portion B in the Figure. As shown in FIG. 1, the board connector of the first embodiment is mounted on the circuit board 2. The circuit board 2 is, for example, a printed circuit board (PCB), in which electrical parts such as relays and so on are mounted on a base board having a wiring pattern of electrically-conductive metal (conductor), or the like.

The board connector 1 of the first embodiment comprises a housing 3 having a connector insertion portion 31 for the insertion of a mating connector (not shown) thereinto, and a plurality of (for example, 32) connector terminals 4, and is mounted in an upstanding condition on the circuit board 2.

The housing 3 is a connector body, and is formed, for example, into a generally closed-bottom elongated rectangular tubular shape, using an insulative synthetic resin. The housing 3 is formed by two narrow wall portions 3*a* disposed respectively at longitudinally-opposite ends and two wide wall portions 3*b* extending in the longitudinal direction, and thus is formed by the four wall portions 3*a*, 3*b*. Heights of the wall portions 3*a*, 3*b* of the housing 3 are not particularly limited, and may be relatively high as shown in the drawings or may be low. A mounting surface 3*d* of a base portion 3*c* of the housing 3 is formed into a flat surface. The mounting surface 3*d* of the housing 3 has flange-like ribs 32 formed at its outer periphery, and is adapted to be mounted on a predetermined position of the circuit board 2 by surface-contact. Incidentally, in FIG. 1 (*a*) to (*d*), FIG. 2 (*a*) to (*b*), and FIG. 3 (*b*), reference numeral 32*a* designate chamfered portions of corner portions of the ribs 32. The interior of the housing 3 is formed as the connector insertion portion 31 into which the mating connector is inserted from an opening. For example, 32 connector terminals 4 are provided within the connector insertion portion 31 and are arranged in a row in a straight line at predetermined intervals.

The connector terminal 4 is formed, for example, into a cross-sectionally rectangular shape, using an electrically-conductive metallic material. The connector terminal 4 includes an electrical contact portion (not shown) projecting into the connector insertion portion 31 so as to be electrically connected to a terminal or the like of the mating connector, and a connection portion 4*a* which projects from a proximal end face of the housing 3 and passes through a connection hole 2*a* of the circuit board 2 and is fixed thereto by soldering or the like to be electrically connected thereto. In the illustrated example, although the 32 connector terminals 4 are provided in one straight row, the connector terminals are not limited to this arrangement, and other number than 32 may be provided in two rows or more.

Figure 3A:
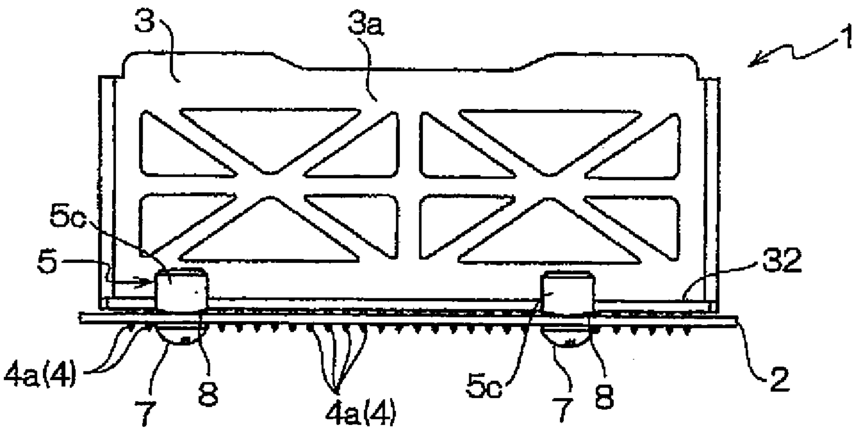
FIG. 3 (*a*) to (*c*) are views showing the first embodiment of the board connector of the present invention, and showing a condition in the process of mounting, (*a*) is a front-elevational view, (*b*) is a side-elevational view and (*c*) is an enlarged cross-sectional view of a portion C in the Figure.
Figure 3B:
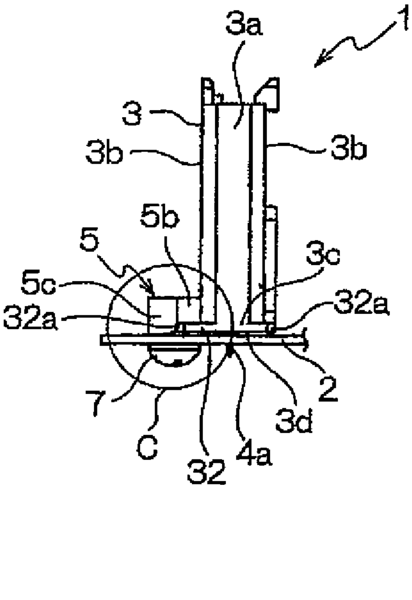
Figure 3C:
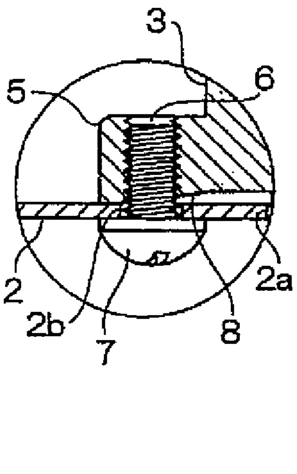
Figure 4A:
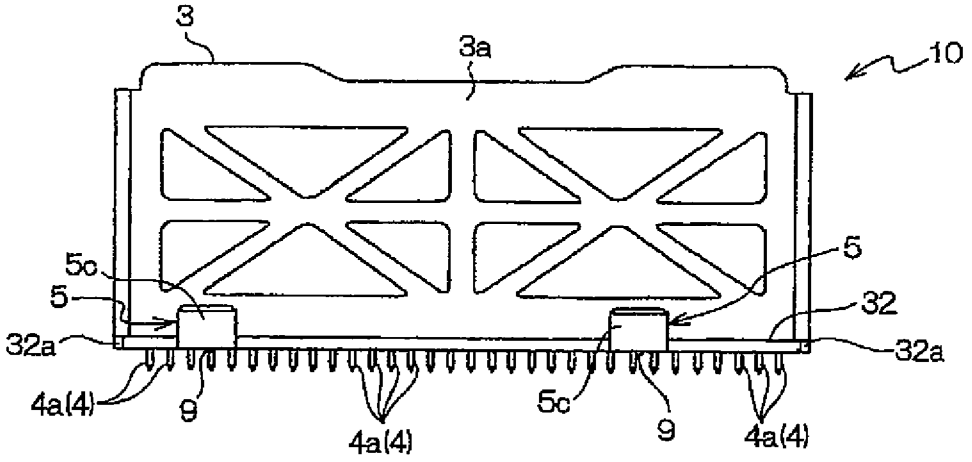
FIG. 4 (*a*) to (*d*) are views showing a second embodiment of a board connector of the present invention, and (*a*) is a front-elevational view, (*b*) is a bottom view, (*c*) is a side-elevational view and (*d*) is an enlarged view of a portion D in the Figure.
Figure 4B:
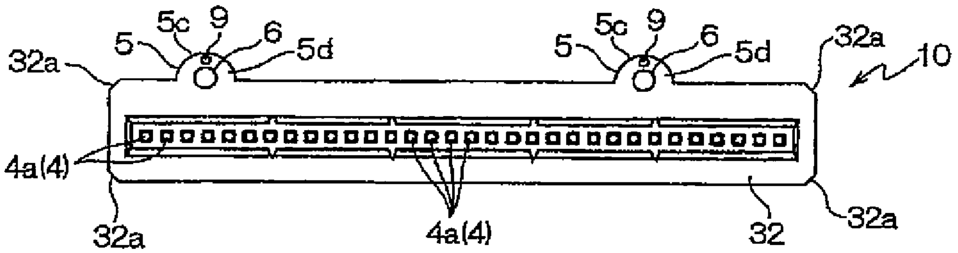
Figure 4C:
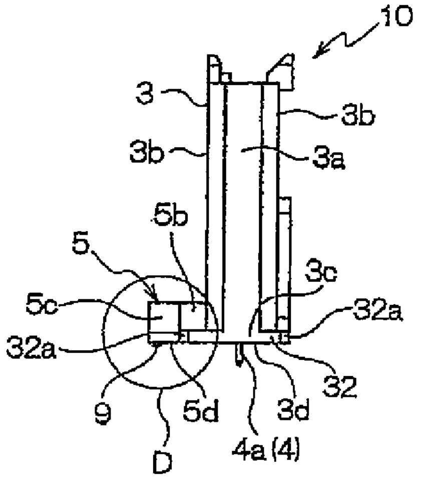
Figure 4D:
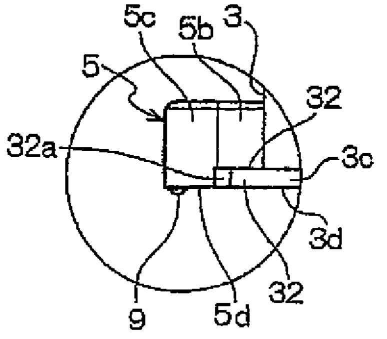
Figure 5A:
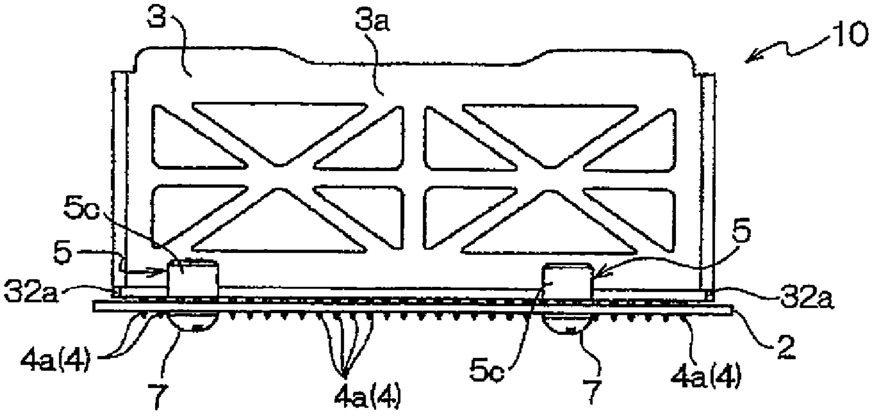
FIG. 5 (*a*) to (*c*) are views showing the second embodiment of the board connector of the present invention, and showing a condition in the process of mounting, (*a*) is a front-elevational view, (*b*) is a side-elevational view and (*c*) is an enlarged cross-sectional view of a portion E in the Figure.
Figure 5B:
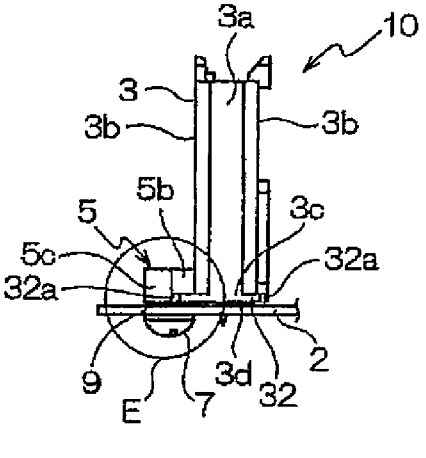
Figure 5C:
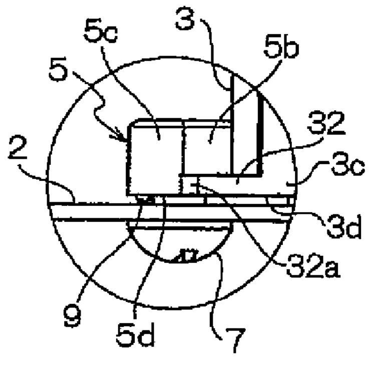

Fixing portions 5 for attaching and fixing the housing 3 to the circuit board 2 are formed at a proximal end portion of an outer wall surface of one longitudinal wall portion 3*b* (see FIG. 3(*c*)) of the housing 3. The fixing portions 5 are provided respectively at two portions of the outer wall surface disposed near respectively to the opposite side walls remote from a central portion of the outer wall surface. The fixing portions 5 are provided to project from the outer wall surface of the housing 3. The fixing portion 5 includes a straight portion 5*b* extending generally straight to an end of the rib 32 in parallel relation thereto, and an arc-shaped portion 5*c* of an arc-shape (for example, a generally semi-circular shape) formed at an end portion of the straight portion 5*b*, and the fixing portion is formed integrally with the housing 3. A screw hole 6 (see FIG. 3(*c*)) having a screw groove formed in an inner surface thereof is formed in the fixing portion 5. The screw hole 6 is formed to extend in a direction of the height of the housing 3, and a screw member (for example, a screw) 7 passing through a through hole 2*b* of the circuit board 2 is threaded into the screw hole 6, and the screw member 7 is tightened, and by doing so, the housing 3 is mounted in an upstanding condition on the circuit board 2.

A bottom surface (fixing surface 5*a*) of the fixing portion 5 is formed into such a shape as to restrain the end face (the mounting surface 3*d*) of the housing 3 from lifting from the circuit board 2 at the time when the fixing portion 5 is fixed to the circuit board 2 by a tightening force of the screw member 7. This fixing surface 5*a* is formed, for example, to have a slanting surface 8. The slanting surface 8 is formed into such a slanting shape that the whole of the fixing surface 5*a* projects toward the circuit board 2 gradually in a direction away from the housing 3. An inclination angle of the slanting surface 8 is within such a range that a compressive deformation caused by a tightening load of the screw member 7 can be compensated for by the slanting surface 8 so that the housing 3 will not be inclined, and the inclination angle can be arbitrarily set by the material of the fixing portion 5 and the tightening force of the screw member 7. Although the slanting surface 8 inclines the whole of the fixing surface 5*a*, it is not limited to this construction, and part of the fixing surface 5*a* may be formed into a slanting shape. In FIG. 2 (*a*) to (*b*), FIG. 3 (*a*) and FIG. 3 (*c*), the slanting surface 8 is shown in an exaggerated manner for better understanding.

For mounting this board connector 1 on the circuit board 2, first, the connection portions 4*a* of the connector terminals 4 projecting from the mounting surface 3*d* of the housing 3 are opposed respectively to the corresponding connection holes 2*a* (see FIG. 3(*c*)) of the circuit board 2, and also the screw holes 6 of the two fixing portions 5 are opposed respectively to the two through holes 2*b* of the circuit board 2. The housing 3 is moved toward the circuit board 2 so as to bring the mounting surface 3*d* of the housing 3 into abutting engagement with the circuit board 2, and the connection portions 4 are inserted respectively into the connection holes 2*a* of the circuit board 2, and also the screw holes 6 of the two fixing portions 5 are aligned respectively with the two through holes 2*b* of the circuit board 2. At this time, the most projecting portion of the slanting surface 8 of the fixing portion 5 abuts against the surface of the circuit board 2 as shown in FIG. 3 (*c*). The screw members 7 are passed respectively through the through holes 2*b* from the side of the circuit board 2 facing away from the side thereof on which the board connector 1 is mounted, and are threaded respectively into the screw holes 6 of the fixing portions 5. By tightening the screw members 7, the board connector 1 is mounted in a fixed condition on the circuit board 2 through the fixing portions 5. By soldering the end portions of the connection portions 4*a* passing respectively through the connection holes 2*a* of the circuit board 2, the connector terminals 4 are electrically connected to the circuit board 2, and the board connector 1 is mounted in an upstanding condition on the circuit board 2.

Thus, the fixing portion 5 are provided at the outer wall surface of the one longitudinal wall portion 3*b* of the housing 3, and therefore for example, in the case where the board connector 1 is mounted on the circuit board 2, with its longitudinal direction extending in the direction of the width of the circuit board 2, the widthwise dimension of the circuit board 2 can be made equal to the longitudinal dimension of the board connector 1, and therefore a compact design of the circuit board 2 can be achieved.

Furthermore, since the fixing portions 5 are provided at the outer wall surface of the one longitudinal wall portion 3*b* of the housing 3, any fixing portion 5 is not provided at the outer wall surface of the other longitudinal wall portion 3*b* of the housing 3, and therefore the wiring pattern can be freely installed on that portion of the circuit board 2 adjacent to the outer wall surface of the other longitudinal wall portion 3*b* of the housing 3, and therefore the degree of freedom of the design of the wiring pattern can be enhanced. And besides, since the two fixing portions 5 are provided at the outer wall surface of the one longitudinal wall portion 3*b* of the housing 3, the board connector 1 can be firmly fixed.

Furthermore, a compressive deformation, occurring when fixing the fixing portion 5 to the circuit board 2 by the tightening force of the screw member 7, can be compensated for by the slanting surface 8, and therefore the housing 3 can be prevented from being inclined. Namely, if fixing portions are provided only at one longitudinal outer wall surface of a housing and also a fixing surface of the fixing portion is formed flush with a mounting surface of the housing, the fixing portion can be compressively deformed or the circuit board can be compressively deformed by a load due to the tightening of the screw member relative to the fixing portion, depending on the material of the synthetic resin, the tightening force, etc., so that the anti-fixing portion side of the housing can be lifted, and the housing can be inclined. Therefore, by providing the slanting surface 8, the compressive deformation caused by the tightening load is compensated for by the slanting surface 8, and therefore the housing 3 can be prevented from being inclined. The angle of this slanting surface 8 is an arbitrary angle for compensating for the compressive deformation, and is arbitrarily set depending on the material of the fixing portion 5 and the tightening force of the screw member 7.

Incidentally, the degree of tightening of the screw member 7 may be adjusted so that the housing 3 will not be inclined. Furthermore, although the two fixing portions 5 are provided only at the outer wall surface of the one longitudinal wall portion 3*b* of the housing 3, a fixing portion (for example, one fixing portion) may be provided at the outer wall surface of the other longitudinal wall portion 3*b* in so far as the degree of freedom of the design of the wiring pattern can be enhanced.

FIG. 4 (*a*) to (*d*) are views showing a second embodiment of a board connector of the present invention, and (*a*) is a front-elevational view, (*b*) is a bottom view, (*c*) is a side-elevational view and (*d*) is an enlarged view of a portion D in the Figure. As shown in FIG. 4, the board connector 10 of the second embodiment differs only in that a projection 9 is formed at a fixing surface 5*a* of a fixing portion 5 so that at the time when the fixing portion 5 is fixed to a circuit board 2 by a tightening force of a screw member 7, an end face (mounting surface 3*d*) of a housing 3 can be restrained from being lifted from a circuit board surface. The other construction is the same as that of the board connector of the first embodiment, and identical function parts are designated by identical reference numerals, respectively, and explanation thereof will be omitted.

The projection 9 is provided at that portion of the fixing surface 5*d* of the fixing portion 5 opposite to the housing 3 with a screw hole 6 disposed therebetween. The projection 9 is so formed as to be crushed and so on by a tightening load to compensate for a compressive deformation caused by a tightening force of the screw member 7 so that the housing 3 will not be inclined. The shape of the projection 9 is not particularly limited in so far as it can compensate for a compressive deformation, and may be any shape such as a cylindrical shape, a prism-shape, a semi-spherical shape, a semi-ellipsoidal shape and so on, and the height of the projection 9 is such a dimension that it can compensate for the compressive deformation, and is arbitrarily set depending on the material of the projection 9 and namely of the fixing portion 5 and the tightening force of the screw member 7. The number and position(s) of the projection(s) 9 are not particularly limited and can be arbitrarily determined.

With this construction, the compressive deformation, occurring when fixing the fixing portion 5 to the circuit board 2 by the tightening force of the screw member 7, is compensated for by the projection 9, and therefore the housing 3 can be prevented from being inclined. The other operational advantages are generally the same as the above-mentioned board connector 1 of the first embodiment.

REFERENCE SIGNS LIST

1 board connector
2 circuit board
3 housing
3*b* wall portion
5 fixing portion
5*a* fixing surface
5*d* fixing surface
6 screw hole
7 screw member
8 slanting surface
9 projection

The invention claimed is:

1. A board connector, comprising:
a circuit board;
a housing comprised of a synthetic resin and mounted in an upstanding manner to the circuit board; and
a fixing portion integrally provided with the housing and having a screw hole into which a screw member passed through the circuit board is threaded, the fixing portion adapted to fix the housing to the circuit board by tightening the screw member,
wherein the fixing portion is provided in a projecting manner near a proximal end portion of the housing at one side of a longitudinal outer wall surface of the housing; and
a fixing surface of the fixing portion adapted to be fixed to an upper surface of the circuit board is formed into a shape that projects toward the circuit board and compensates for a compressive deformation so as to restrain an end face of the housing from lifting from the circuit board when the fixing portion is fixed to the circuit board by a tightening force of the screw member, wherein the fixing surface is formed as a slanting surface that gradually projects toward the circuit board in a direction away from the housing.

* * * * *